US010764691B2

(12) United States Patent
Song et al.

(10) Patent No.: US 10,764,691 B2
(45) Date of Patent: Sep. 1, 2020

(54) SPEAKER

(71) Applicant: AAC Technologies Pte. Ltd., Singapore (SG)

(72) Inventors: Wei Song, Shenzhen (CN); Shuwen Wu, Shenzhen (CN); Zhiyuan Chen, Shenzhen (CN); Fan Zhang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/528,691

(22) Filed: Aug. 1, 2019

(65) Prior Publication Data
US 2020/0053477 A1    Feb. 13, 2020

(30) Foreign Application Priority Data

Aug. 9, 2018    (CN) .................... 2018 2 1284904 U

(51) Int. Cl.
| | |
|---|---|
| *H04R 3/00* | (2006.01) |
| *H04R 9/06* | (2006.01) |
| *H05K 1/02* | (2006.01) |
| *H05K 1/11* | (2006.01) |
| *H05K 1/14* | (2006.01) |
| *H05K 1/18* | (2006.01) |

(52) U.S. Cl.
CPC ............... *H04R 9/06* (2013.01); *H04R 3/00* (2013.01); *H05K 1/0277* (2013.01); *H05K 1/11* (2013.01); *H05K 1/14* (2013.01); *H05K 1/181* (2013.01); *H04R 2400/11* (2013.01); *H05K 2201/10083* (2013.01)

(58) Field of Classification Search
CPC ........ H04R 9/06; H04R 3/00; H04R 2400/11; H05K 1/0277; H05K 1/11; H05K 1/14; H05K 1/181; H05K 2201/10083
USPC .................................................. 381/111, 117
See application file for complete search history.

(56) References Cited

U.S. PATENT DOCUMENTS

2015/0016659 A1*    1/2015 Wang .................... H04R 9/046
                                                                    381/412

\* cited by examiner

*Primary Examiner* — Ammar T Hamid
(74) *Attorney, Agent, or Firm* — W&G Law Group LLP

(57) ABSTRACT

The present disclosure provides a speaker, including a flexible circuit board, a holder, a diaphragm received in the holder, and a voice coil for driving the diaphragm to vibrate. The flexible circuit board includes a connecting portion received in the holder and an extension portion extending from the connecting portion to outside of the holder. The voice coil is electrically connected to the connecting portion. The flexible circuit board further includes a first pad located at an upper surface of the connecting portion and electrically connected to the voice coil, and a second pad located at an upper surface of the extension portion. The extension portion is folded over with respect to the connecting portion, and a lower surface of the extension portion is attached to the holder.

6 Claims, 5 Drawing Sheets

SPEAKER

TECHNICAL FIELD

The present disclosure relates to the field of electroacoustic transduction, and in particular, to a speaker.

BACKGROUND

A flexible printed circuit board (FPC board for short) is manufactured by adopting an insulating substrate such as a flexible polyester film or polyimide and combining the line formed on a copper foil by etching, and has high reliability and excellent flexibility. It can be freely bent, wound and folded, and can be arranged according to the spatial layout requirements and arbitrarily move and expand and contract in three-dimensional space, so as to achieve the integration of component assembly and wire connection. The use of the FPC board can greatly reduce a volume of a speaker, and is suitable for the development of the speaker in the direction of high density, miniaturization, and high reliability. Therefore, FPC boards have been widely used in aerospace, military, mobile communications, laptop computers, computer peripherals, handheld computers, digital cameras and other fields or products.

In the related art, when the FPC board is applied to the speaker, a pad located on the FPC board and electrically connected to the voice coil is not on the same side as an external pad of the speaker, such that the FPC board often needs to use a double-sided board design, and the pad connected to the voice coil and the external pad of the speaker are conducted through a via hole. However, the double-sided board is relatively expensive.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

The present disclosure will be further illustrated with reference to the accompanying drawings and the embodiments.

Figure 1:
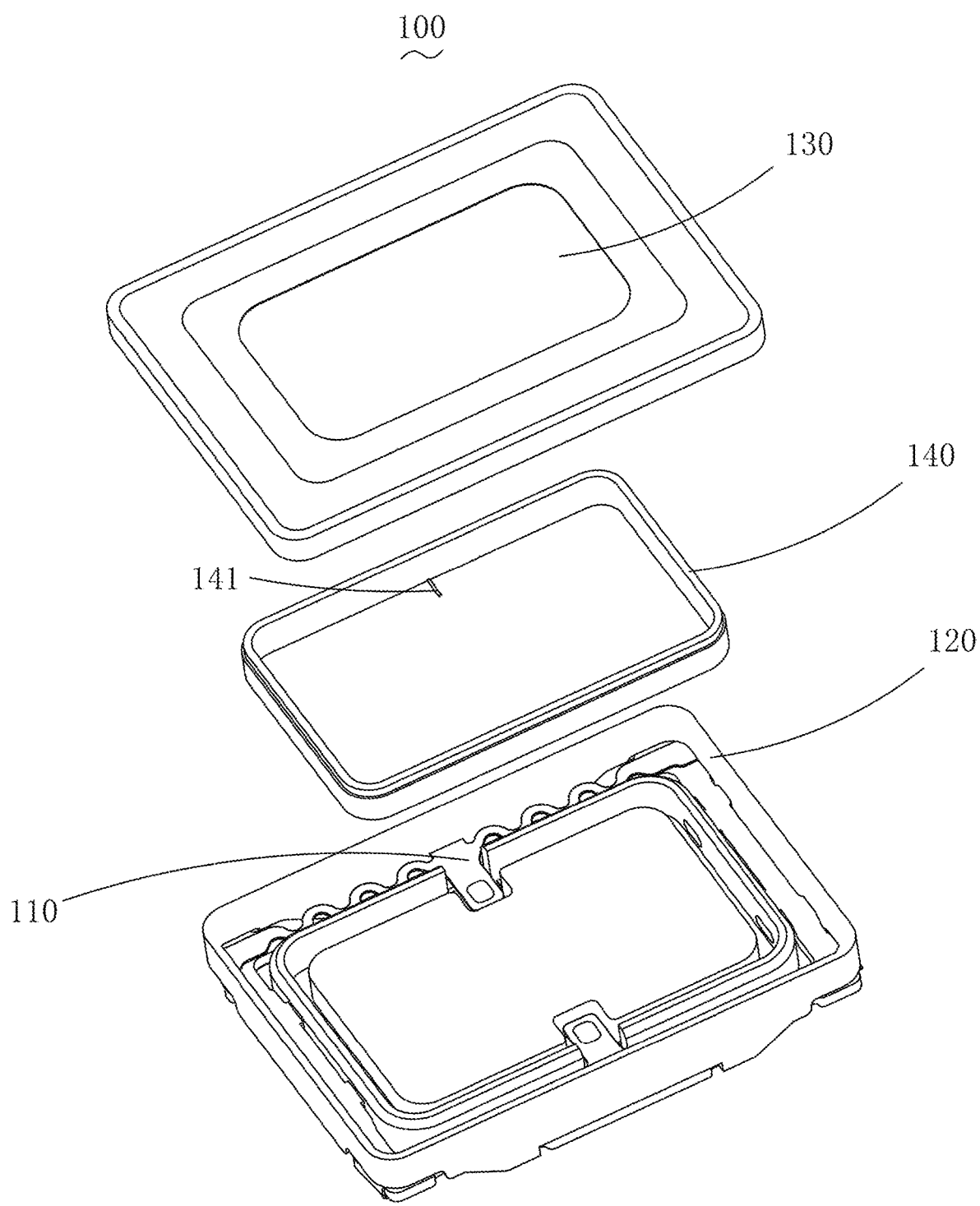
FIG. 1 is an exploded diagram of a speaker in an embodiment of the present disclosure.
Figure 2:
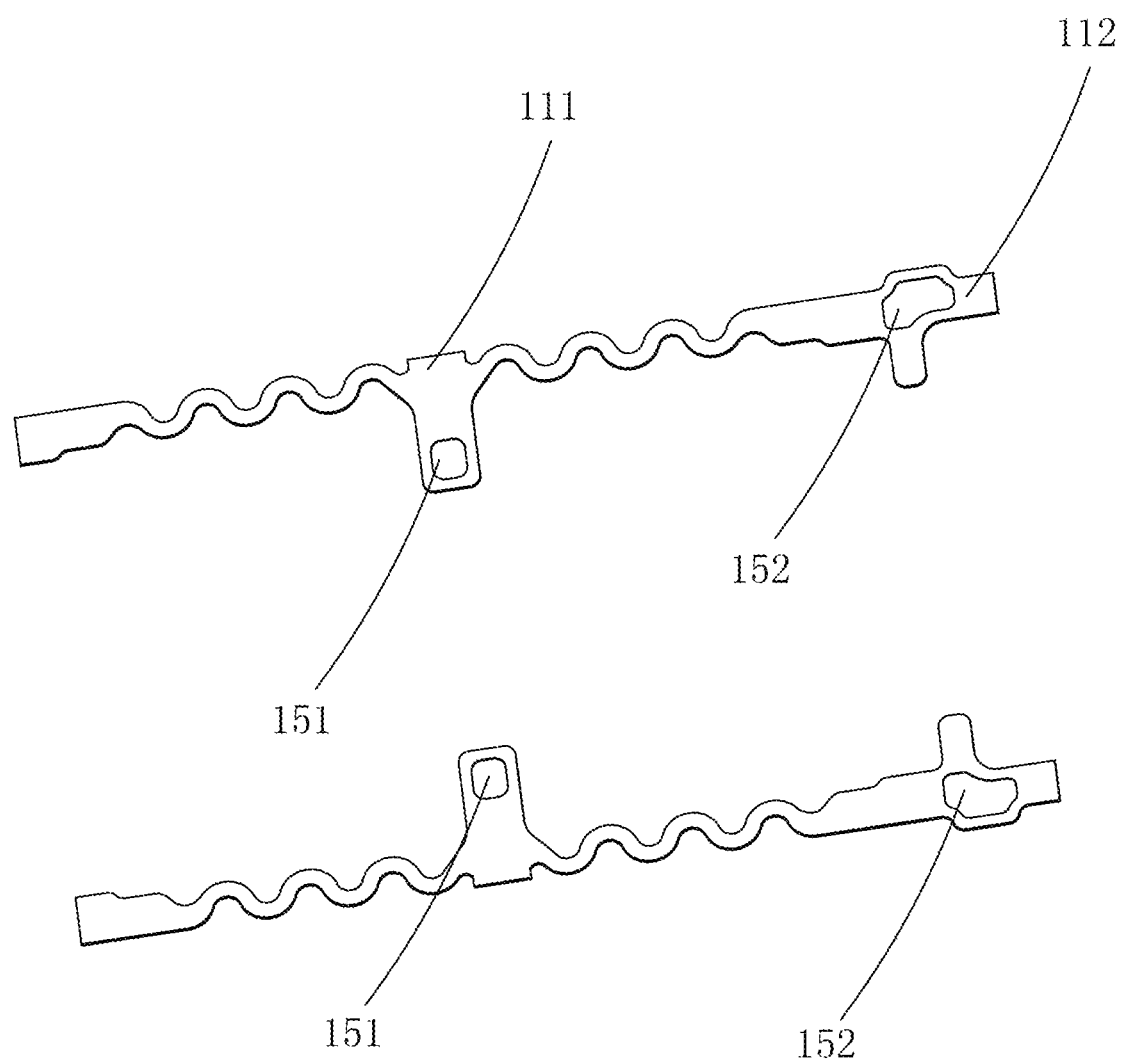
FIG. 2 is a structural schematic diagram of a flexible circuit board in an embodiment of the present disclosure.
Figure 3:
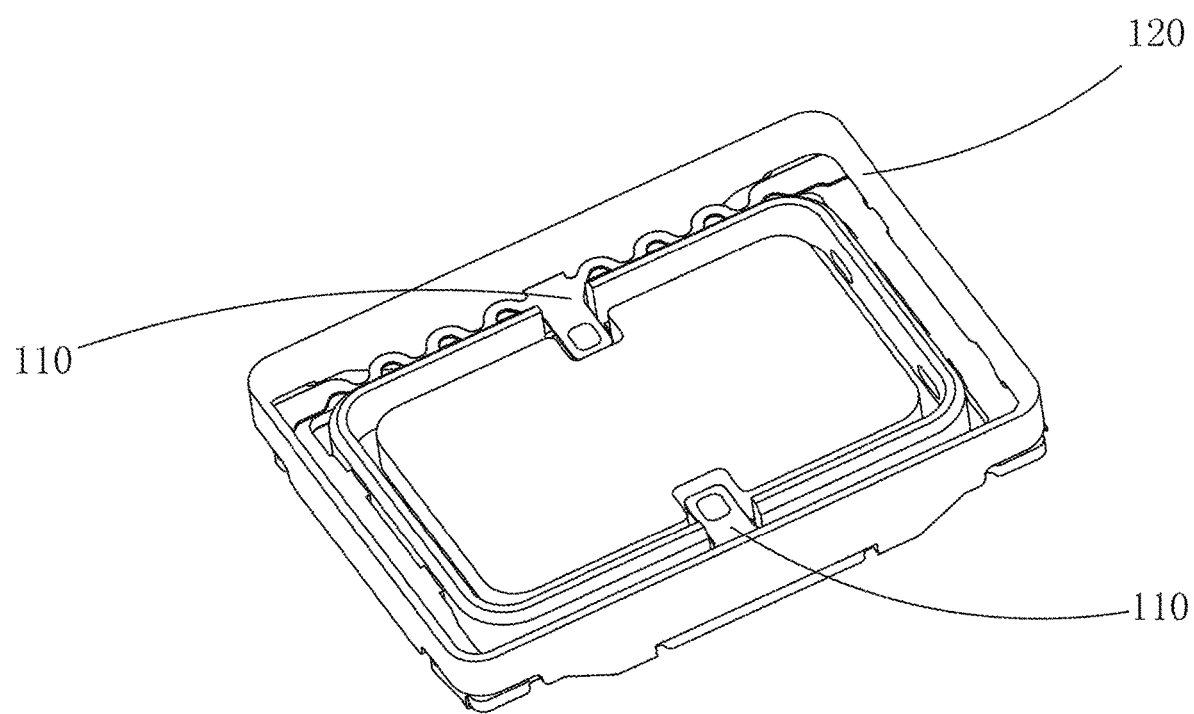
FIG. 3 is a perspective diagram of partial structure of a speaker in an embodiment of the present disclosure.
Figure 4:
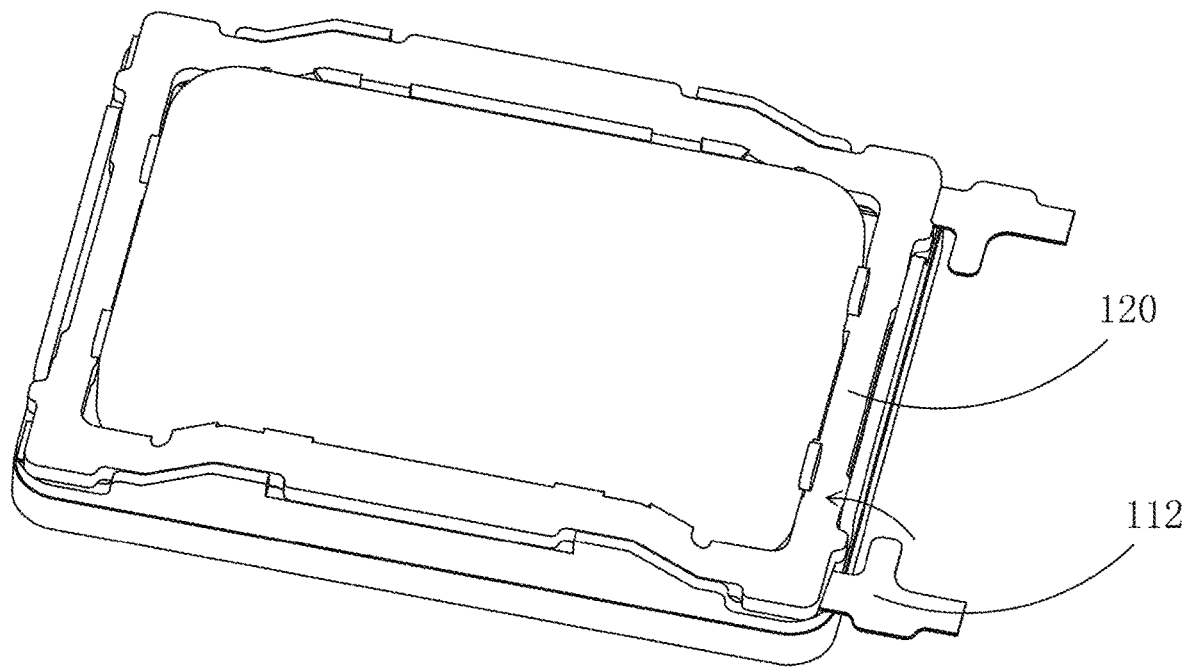
FIG. 4 is a schematic diagram of an extension portion in an embodiment of the present disclosure before being folded over.

As shown in FIG. 1, the speaker 100 provided by the embodiment of the present disclosure includes a flexible circuit board 110, a holder 120, a diaphragm 130 received in the holder 120, and a voice coil 140 that drives the diaphragm 130 to vibrate. As shown in FIG. 2, the flexible circuit board 110 includes a connecting portion 111 received in the holder 120 and an extension portion 11 extending from the connecting portion 111 to the outside of the holder 120. As shown in FIGS. 1 and 3, the voice coil 140 is electrically connected to the connecting portion 111. As shown in FIG. 2, the flexible circuit board 110 further includes a first pad 151 located at an upper surface of the connecting portion 111 and electrically connected to the voice coil 140, and a second pad 152 located at an upper surface of the extension portion 112. As shown in FIG. 4, the extension portion 112 is folded over with respect to the connecting portion 111, and a lower surface of the extension portion 112 is attached to the holder 120.

As shown in FIGS. 1 and 2, a welding spot 141 of the voice coil 140 is connected to the first pad 151 correspondingly. After the extension portion 112 is folded over and attached to the holder 120, when the flexible circuit board 110 is a single-sided board, the first pad 151 and the second pad 152 may face towards different directions, and there is no need to use a double-sided board, i.e., two pads on a surface at the same side of the flexible circuit board can be connected to the voice coil and an external appliance of the speaker, thereby reducing the cost of the flexible circuit board and thus reducing the cost of the speaker.

Figure 5:
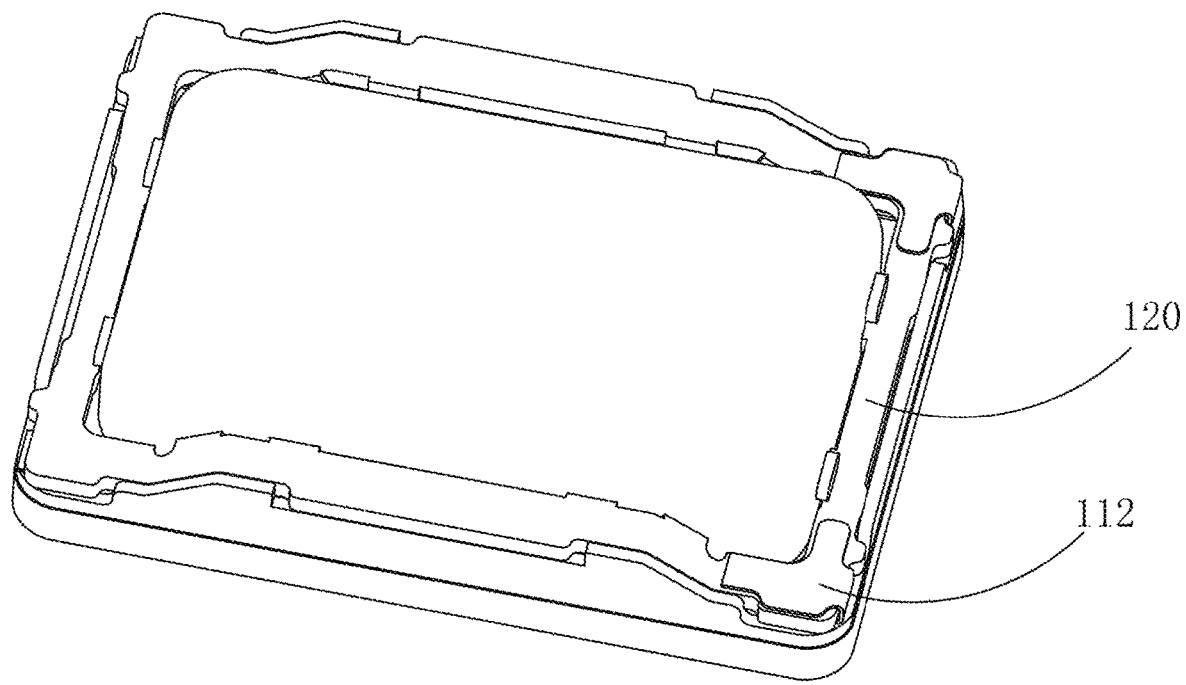
FIG. 5 is a schematic diagram of an extension portion in an embodiment of the present disclosure after being folded over.

As shown in FIG. 4 and FIG. 5, in the embodiment of the present disclosure, the extension portion 112 is folded over by 180 degrees and then attached to the holder 120 by a glue. After folding over the extension portion 112 in the direction indicated by the arrow in FIG. 4 and attached the extension portion 112 to the holder 120, a speaker as shown in FIG. 5 is formed, in which the first pad 151 faces towards an upper surface of the speaker and the second pad 152 faces towards a lower surface of the speaker.

As shown in FIGS. 2 and 3, the speaker includes two flexible circuit boards 110 symmetrically disposed on two sides of the holder 120. Each of the flexible circuit boards 110 is provided with one first pad 151 and one second pad 152.

Compared with the related art, the speaker of the present disclosure folds over the extension portion of the flexible circuit board and then attaches it to the holder 120, uses two pads on a surface at the same side of the flexible circuit board to connect the voice coil with an external appliance of the speaker and selects a single-sided board instead of a double-sided board as the flexible circuit board, thereby reducing the cost of the speaker.

What has been described above is only an embodiment of the present disclosure, and it should be noted herein that one ordinary person skilled in the art can make improvements without departing from the inventive concept of the present disclosure, but these are all within the scope of the present disclosure.

What is claimed is:

1. A speaker, comprising:
   a flexible circuit board;
   a holder;
   a diaphragm received in the holder; and
   a voice coil for driving the diaphragm to vibrate,
   wherein the flexible circuit board comprises a connecting portion received in the holder and an extension portion extending from the connecting portion to outside of the holder, and the voice coil is electrically connected to the connecting portion,
   the flexible circuit board further comprises a first pad located at an upper surface of the connecting portion and electrically connected to the voice coil, and a second pad located at an upper surface of the extension portion, and the extension portion is folded over with respect to the connecting portion, and a lower surface of the extension portion is attached to the holder.

2. The speaker as described in claim 1, wherein the extension portion is folded over by 180 degrees and then attached to the holder.

3. The speaker as described in claim 2, wherein the flexible circuit board is a single-sided board.

4. The speaker as described in claim 3, wherein the extension portion and the holder are bonded by glue into one piece.

5. The speaker as described in claim 1, comprising two flexible circuit boards symmetrically arranged on two sides of the holder.

6. The speaker as described in claim 5, wherein each of the two flexible circuit boards is provided with a first pad and a second pad.

\* \* \* \* \*